(12) United States Patent
Lacey et al.

(10) Patent No.: US 6,384,628 B1
(45) Date of Patent: May 7, 2002

(54) MULTIPLE VOLTAGE SUPPLY PROGRAMMABLE LOGIC DEVICE

(75) Inventors: Timothy M. Lacey, Bedford, NH (US); Jeffrey Mark Marshall, Dallas, TX (US); David L. Johnson, Pleasanton, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/540,106

(22) Filed: Mar. 31, 2000

(51) Int. Cl.$^7$ .............................................. H01L 25/00
(52) U.S. Cl. .............................. 326/41; 326/80; 326/63
(58) Field of Search ................................ 326/41, 62, 63, 326/80, 82, 86

(56) References Cited

U.S. PATENT DOCUMENTS

| | | | | |
|---|---|---|---|---|
| 5,132,555 A | * | 7/1992 | Takahashi | 307/296.1 |
| 6,118,302 A | * | 9/2000 | Turner et al. | 326/68 |
| 6,163,170 A | * | 12/2000 | Takinomi | 326/81 |

OTHER PUBLICATIONS

"Spartan and Spartan–XL Families Field Programmable Gate Arrays", Xilinx, Mar. 2, 2000, pp. 4–1 to 4–66.
"An Innovative, Segmented High Performance EFGA Family with Varible–Grain–Architecture and Wide–Gating Functions", By Om Agrawal et al., pp. 17–26
"A New High Density and Very Low Cost ReprogramableFPGA Architecture", By Sinan Kaptanoglu et al., pp. 3–13.
"Integrated Product–Term Logic in Apex 20K Devices", Altera, Apr. 1999, ver. 1.0, pp. 1–12.
"XC4000XLA/XV Field Programmable Gate Arrays",Xilinx, Oct. 18, 1999, pp. 6–157 to 6–170.
"VIRTEX™ 2.5V Field Programmable Gate Arrays", Xilinx, Apr. 2, 2001, pp. 1–20.
"Max 7000 Programmable Logic Device Family", Altera, Mar. 2001, ver. 9.1, pp. 1962.
"Max 9000 Program Logic Device Family", Altera, Jul. 1999, ver. 6.01, pp. 1–40.
"Flex 10K Embedded Programmable Logic Device Family", Altera, Mar. 2001, ver. 4.1, pp. 1–128.
"Apex II Programmable Logic Device Family", Altera, May, 2001, ver. 1.1, ver. pp. 1–96.
"Flex 8000 Programmable Logic Device Family", Altera, Jun. 1999, ver. 10.01, pp. 349–410.

* cited by examiner

*Primary Examiner*—Michael Tokar
*Assistant Examiner*—Anh Q. Tran
(74) *Attorney, Agent, or Firm*—Christopher P. Maiorana, P.C.

(57) ABSTRACT

A programmable logic device comprising a core circuit, a first circuit, a second circuit, and a third circuit. The core circuit may be configured to (i) operate at a first supply voltage, (ii) receive one or more internal input signals, and (iii) generate one or more internal output signals. The first circuit may be configured to generate said first supply voltage in response to a second supply voltage. The second circuit may be configured to (i) operate at a third supply voltage and (ii) generate said one or more internal input signals in response to one or more external input signals. The third circuit may be configured to (i) operate at said third supply voltage and (ii) generate one or more external output signals in response to said one or more internal output signals.

22 Claims, 4 Drawing Sheets

MULTIPLE VOLTAGE SUPPLY PROGRAMMABLE LOGIC DEVICE

CROSS-REFERENCE TO RELATED APPLICATIONS

The present invention may relate to application U.S. Ser. No. 09/475,879, filed Dec. 30, 1999, which is hereby incorporated by reference in its entirety.

FIELD OF THE INVENTION

The present invention relates to programmable logic devices generally and, more particularly, to a programmable logic device architecture that may operate at multiple supply voltages.

BACKGROUND OF THE INVENTION

Traditionally there are two types of programmable logic architectures: complex programmable logic devices (CPLDs) and field programmable gate arrays (FPGAs). The CPLD can be constructed as a one-dimensional array of logic blocks made of 16 macrocells and a product term array connected through a single central interconnect scheme. The CPLD achieves high performance by being able to complete a complex logic function in a single pass of the logic array and has predictable timing by connecting every output or I/O pin to every logic block input through the central interconnect structure. The CPLD can be non-volatile by using an EEPROM process.

However, the architecture of the conventional CPLD has disadvantages. A complex process technology limits performance and increases cost. A high standby power limits capacity and applications. The conventional CPLD has no available on-chip RAM. The maximum capacity of the conventional CPLD is limited by interconnect structure performance, power, technology and die cost. The core voltages, I/O voltages, and I/O standards of the conventional CPLD are not flexible. The I/O cells need a synchronous output enable (OE) to support a synchronous circuit architecture with minimal bus latency (e.g., as found in NoBL™ SRAMs manufactured by Cypress Semiconductor Corp. or ZBT™ devices manufactured by Integrated Device Technology) memory.

A FPGA architecture is constructed from a two dimensional array of logic blocks called CLBs. The CLBs are made from 4-input look-up-tables (LUTs) and flip-flops. The LUTs can be used as distributed memory blocks. The CLBs are connected by a segmented interconnect structure. The FPGA architecture supports a low standby power and the LUTs can use a simple logic CMOS process. Since the two-dimensional array of CLBs and the segmented interconnect structure are scalable, the FPGA can achieve high densities.

However, the architecture of the FPGA has disadvantages. A volatile process requires a FLASH/EEPROM to be added to the design. The segmented routing architecture limits performance and makes timing unpredictable. Implementing a dual port or FIFO memory with LUTs is slow and inefficient. A complex "design-in-process" is required because the conventional FPGAs do not have predictable timing, short compile times, in-system-reprogrammability (e.g., ISR®, a registered Trademark of Cypress Semiconductor Corp.) or pin fixing. The core voltage of the conventional FPGA is (i) not flexible and (ii) driven by the current process. The conventional FPGA makes product migration very difficult and does not support full JTAG boundary scan and configuration.

SUMMARY OF THE INVENTION

The present invention concerns a programmable logic device comprising a core circuit, a first circuit, a second circuit, and a third circuit. The core circuit may be configured to (i) operate at a first supply voltage, (ii) receive one or more internal input signals, and (iii) generate one or more internal output signals. The first circuit may be configured to generate the first supply voltage in response to a second supply voltage. The second circuit may be configured to (i) operate at a third supply voltage and (ii) generate the one or more internal input signals in response to one or more external input signals. The third circuit may be configured to (i) operate at the third supply voltage and (ii) generate one or more external output signals in response to the one or more internal output signals.

The objects, features and advantages of the present invention include providing a programmable logic device architecture that may (i) reduce power consumption; and/or (ii) provide an on-chip voltage regulator for a flexible core voltage.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
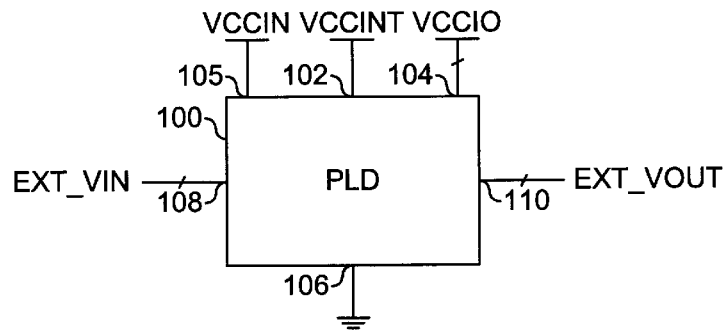
FIG. 1 is a block diagram of a preferred embodiment of the present invention.

Referring to FIG. 1, a block diagram of a programmable logic device (PLD) 100 is shown in accordance with a preferred embodiment of the present invention. The PLD 100 may be implemented using an advanced CMOS logic process. The PLD 100 may be implemented as a volatile or non-volatile device. When a non-volatile device is desired, the PLD 100 may be implemented with a separate non-volatile storage device within the same package. The PLD 100 may be implemented, in one example, in 0.18 $\mu$m technology that generally has a maximum internal core supply voltage of 1.8 v. The PLD 100 may support, in one example, an external core supply voltage (e.g., VCCINT) of 3.3V, 2.5V, or 1.8V. The PLD 100 may have an internal voltage regulator. The range of external core voltage levels may provide for the migration of previous applications to the PLD 100 without requiring a change in a power supply scheme.

The PLD 100 may have an input 102 that may receive the supply voltage VCCINT, an input 104 that may receive a supply voltage (e.g., VCCIO), an input 105 that may receive a supply voltage (e.g., VCCIN), an input 106 that may receive a ground voltage (e.g., VSS), an input 108 that may receive one or more external input signals (e.g., EXT_VIN), and an output 110 that may present one or more external output signals (e.g., EXT_VOUT) to one or more external circuits. The supply voltage VCCINT may comprise, in one example, voltage levels of 3.3 volts, 2.5 volts or 1.8 volts. The supply voltages VCCIO and VCCIN may be the same supply voltage or independent supply voltages. The supply voltages VCCIO and VCCIN may comprise, in one example, voltage levels of 3.3 volts, 2.5 volts, 1.8 volts, and 1.5 volts. The PLD 100 may have a single input configured to receive the supply voltage VCCINT and one or more inputs configured to receive the supply voltages VCCIO and VCCIN. The signal EXT_VIN may swing, in one example, between the ground potential VSS and a voltage level of about 1.5–3.3 volts. The signal EXT_VOUT may swing between the ground potential VSS and a voltage level of about 1.5–3.3. volts. The PLD 100 may, in one example, level-shift input voltages that are greater than or less than an internal core voltage. Similarly, the PLD 100 may be configured to level-shift internal output signals to I/O voltage levels.

Figure 2:
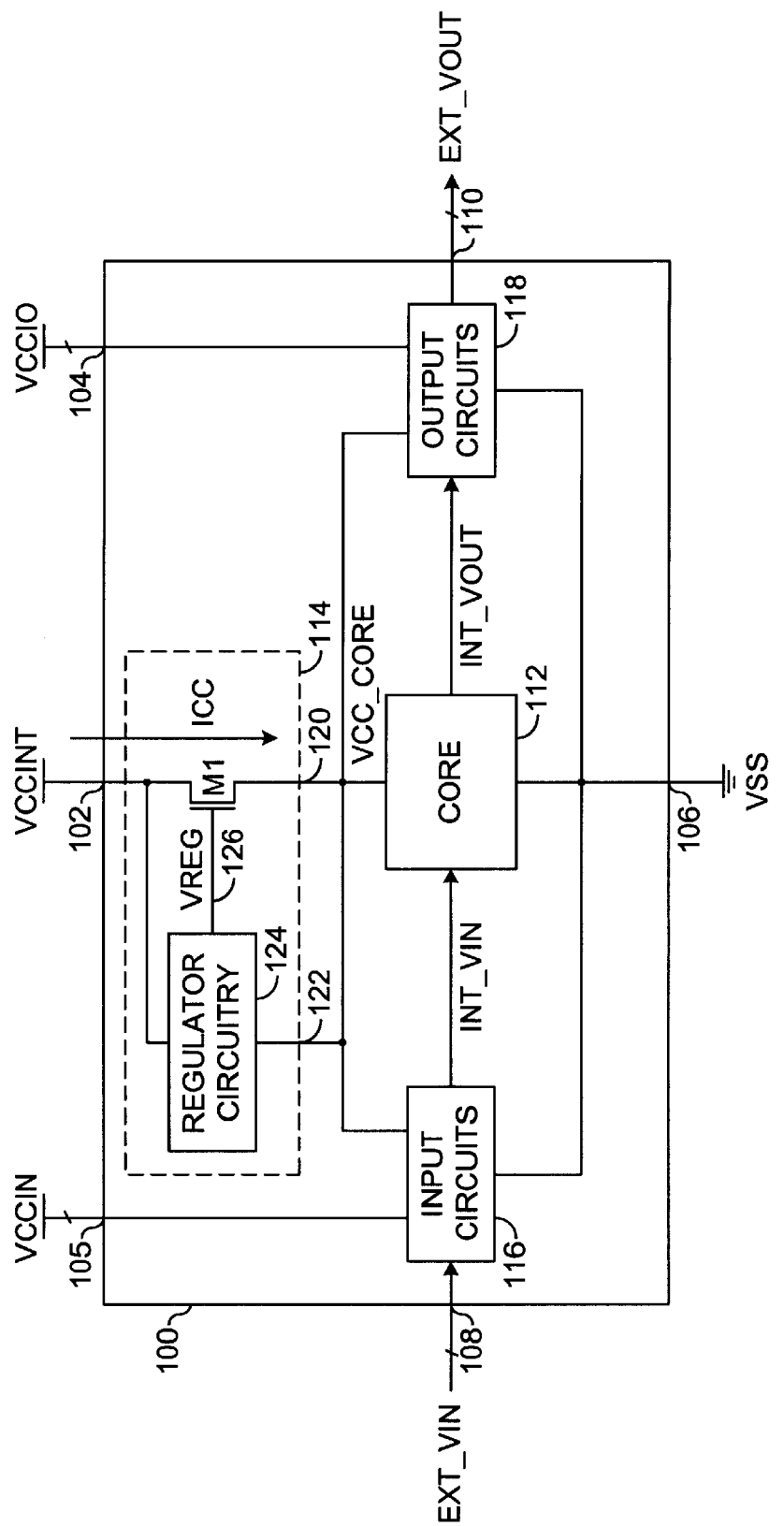
FIG. 2 is a detailed block diagram of an embodiment of the present invention.

Referring to FIG. 2, a more detailed block diagram of the PLD 100 is shown. The PLD 100 may comprise a circuit 112, a circuit 114, a circuit 116, and a circuit 118. The circuit 112 may comprise, in one example, a programmable logic portion of the PLD 100. The circuit 114 may be implemented, in one example, as a voltage regulator. The circuit 116 may be implemented, in one example, as an input circuit. The circuit 118 may be implemented, in one example, as an output circuit. The external core supply voltage VCCINT may be presented to an input of the circuit 114. The circuit 114 may have (i) an output 120 that may present an internal core supply voltage (e.g., VCC_CORE) to an input of the circuits 112, 116, and 118 and (ii) an input 122 that may be used to monitor the output 120. The circuit 114 may be configured to generate the internal core supply voltage VCC_CORE in response to the external core supply voltage VCCINT. The circuit 114 may be configured to maintain the internal supply voltage VCC_CORE at a constant predetermined value. By maintaining the internal supply voltage VCC_CORE at a constant value, the circuit 114 may provide a core supply current (e.g., ICC) that is independent of variations in the external supply voltage VCCINT.

The circuit 116 may be configured to (i) operate at the supply voltage VCCIN and (ii) generate one or more internal input signals (e.g., INT_VIN) in response to (i) one or more external input signals EXT_VIN and (ii) the internal core supply voltage VCC_CORE. The signals INT_VIN will generally swing between the ground voltage VSS and the internal core supply voltage VCC_CORE regardless of the maximum voltage level of the signals EXT_VIN.

The circuit 118 may be configured to (i) operate at the supply voltage VCCIO and (ii) generate the external output signals EXT_VOUT in response to one or more internal output signals (e.g., INT_VOUT) and the supply voltage VCCIO.

The circuit 114 may comprise, in one example, a regulator circuit 124 and a transistor M1. The transistor M1 may be implemented, in one example, as one or more NMOS transistors. However, other types and polarities of transistors may be implemented to meet the design criteria of a particular application. The external supply voltage VCCINT may be presented to a first input of the circuit 124. The internal core supply voltage VCC_CORE may be presented to a second input of the circuit 124. The circuit 124 may have an output 126 that may present a control signal (e.g., VREG) to a gate of the transistor M1. A source of the transistor M1 may be connected to the external core supply voltage VCCINT. A drain of the transistor M1 generally presents the internal core supply voltage VCC_CORE. The regulator circuit 124 may be configured to monitor a voltage difference between the external core supply voltage VCCINT and the internal core supply voltage VCC_CORE. The circuit 124 may be configured to generate the signal VREG in response to the difference between the supply voltages VCCINT and VCC_CORE. The signal VREG may be used to control conduction of the transistor M1 such that the internal core supply voltage VCC_CORE is generally maintained at a substantially constant predetermined value. In one example, the predetermined value may be 1.8 volts.

Figure 3:
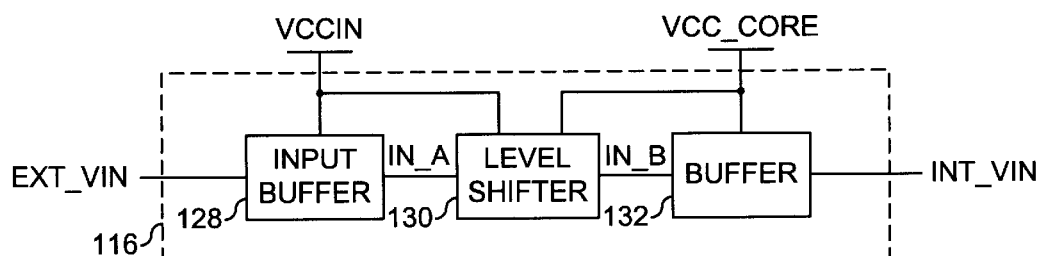
FIG. 3 is a detailed block diagram of an input circuit of FIG. 2.

Referring to FIG. 3, a more detailed block diagram of the circuit 116 is shown. The circuit 116 may comprise a circuit 128, a circuit 130, and a circuit 132. The circuit 128 may be implemented, in on example, as an input buffer. The circuit 130 may be implemented, in one example, as a level shifter circuit. The circuit 132 may be implemented, in one example, as a buffer circuit. The circuit 128 may have a first input that may receive the signal EXT_VIN, a second input that may receive the supply voltage VCCIN, and an output that may present a signal (e.g., IN_A) to a first input of the circuit 130. The circuit 128 may be configured to generate the signal IN_A in response to the signal EXT_VIN.

The circuit 130 may have a second input that may receive the supply voltage VCCIN, a third input that may receive the internal core supply voltage VCC_CORE, and an output that may present a signal (e.g., IN_B) to a first input of the circuit 132. The circuit 130 may be configured to generate the signal IN_B in response to the signal IN_A and the supply voltage VCC_CORE.

The circuit 132 may have a second input that may receive the supply voltage VCC_CORE and an output that may present the signal INT_VIN. The circuit 132 may be configured to generate the signal INT_VIN in response to the signal IN_B.

Figure 4:
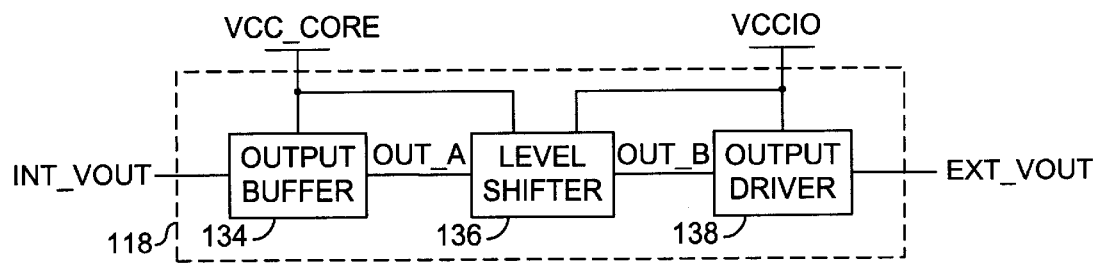
FIG. 4 is a detailed block diagram of an output circuit of FIG. 2.

Referring to FIG. 4, a more detailed block diagram of the circuit 118 is shown. The circuit 118 may comprise a circuit 134, a circuit 136, and a circuit 138. The circuit 134 may be implemented, in on example, as an output buffer. The circuit 136 may be implemented, in one example, as a level shifter circuit. The circuit 138 may be implemented, in one example, as an output driver circuit. The circuit 134 may have a first input that may receive the signal INT_VOUT, a second input that may receive the supply voltage VCC_CORE, and an output that may present a signal (e.g., OUT_A) to a first input of the circuit 136. The circuit 134 may be configured to generate the signal OUT_A in response to the signal INT_VOUT.

The circuit 136 may have a second input that may receive the supply voltage VCC_CORE, a third input that may receive the supply voltage VCCIO, and an output that may present a signal (e.g., OUT_B) to a first input of the circuit 138. The circuit 136 may be configured to generate the signal OUT_B in response to the signal OUT_A and the supply voltage VCCIO.

The circuit 138 may have a second input that may receive the supply voltage VCCIO and an output that may present the signal EXT_VOUT. The circuit 132 may be configured to generate the signal EXT_VOUT in response to the signal OUT_B.

Figure 5:
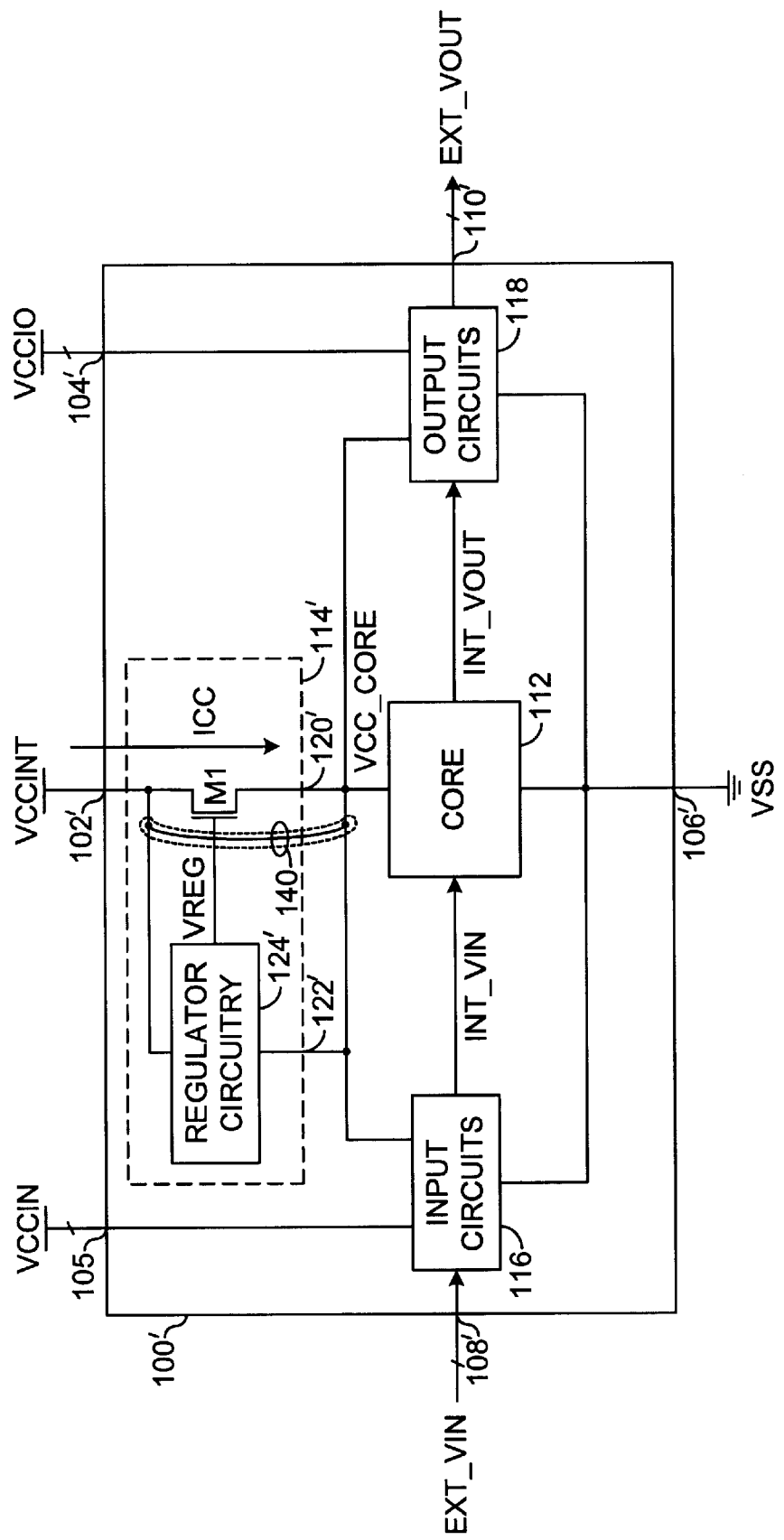
FIG. 5 is a detailed block diagram of an alternate embodiment.

Referring to FIG. 5, a block diagram of a circuit 100' illustrating an alternate embodiment is shown. The circuit 100' may be implemented similarly to the circuit 100. However, the circuit 100' may comprise a circuit 114'. The circuit 114' may be implemented similarly to the circuit 114, except that a metal bonding option 140 may be jumpered. The metal bonding option 140 may short the source and drain of the transistor M1' thereby connecting the external core supply voltage VCCINT directly to the core circuit 112. When the metal bonding option 140 is jumpered, the supply voltage VCCINT is generally limited to the core voltage VCC_CORE. In one example, the supply voltage VCCINT may be limited to 1.8 volts. The metal bonding option 140 may be implemented, in one example, as a metal masking step in the production of the PLD 100.

Figure 6:
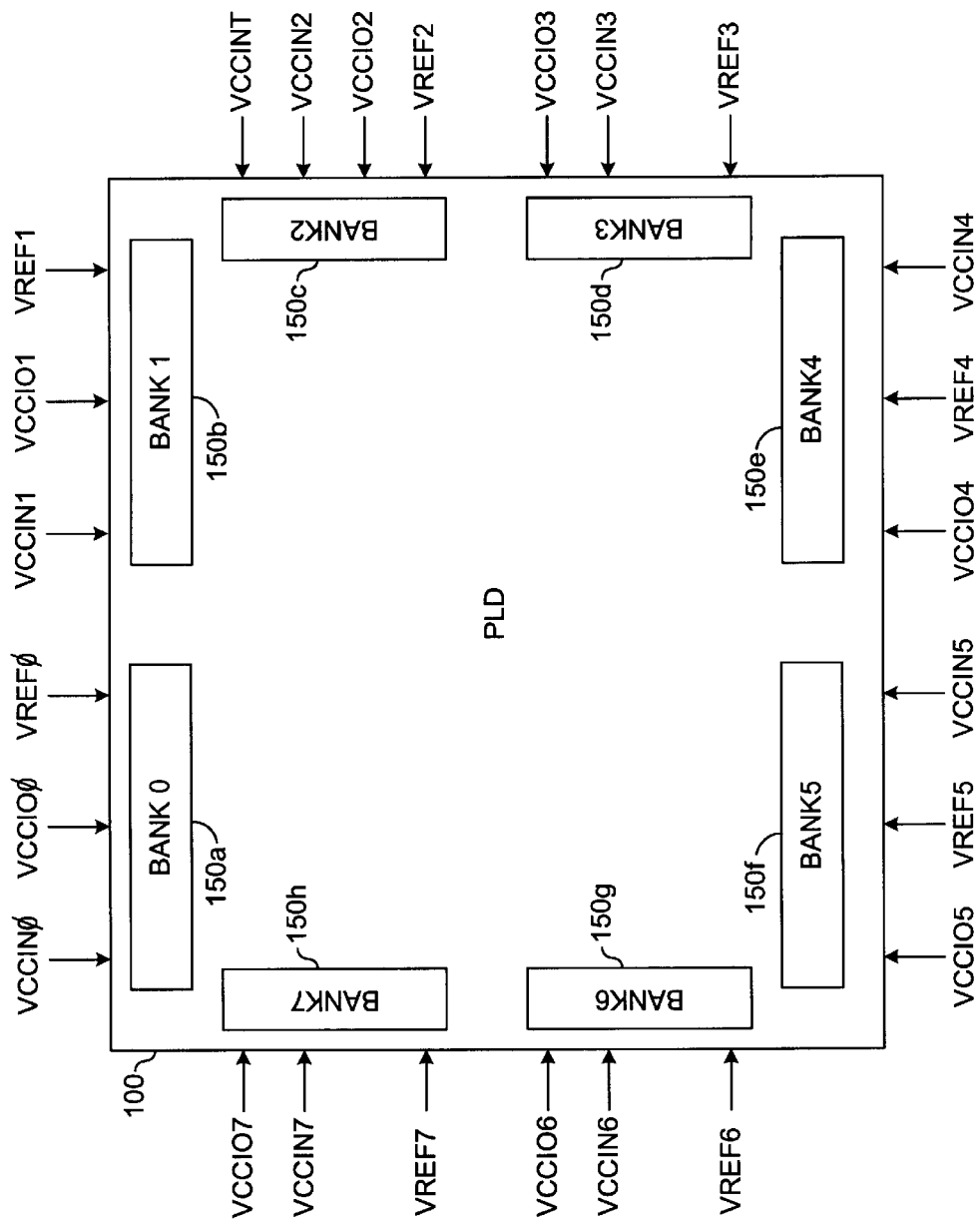
FIG. 6 is a detailed block diagram illustrating multiple I/O voltage supplies in accordance with the present invention.

Referring to FIG. 6, a block diagram of the PLD 100 illustrating a number of I/O banks and voltage supply pins is shown. In one example, the PLD 100 may have 8 I/O banks 150a–150h. Each of the I/O banks 150a–150h may have an independent output supply voltage (e.g., VCCIO0–VCCIO7) and an independent input supply voltage (e.g., VCCIN0–VCCIN7). Each of the output voltage supplies VCCIO0–VCCIO7 may have a similar or different value than the other output supply voltages. For example, VCCIO1 may have a voltage level of 3.3 volts while VCCIO2 may have a voltage level of 2.5 volts. Each of the input voltage supplies VCCIN0–VCCIN7 may have a similar or different value than the other input supply voltages. For example, VCCIN1 may have a voltage level of 3.3 volts while VCCIN2 may have a voltage level of 2.5 volts. The input supply voltages VCCIN0–VCCIN7 may be independent of the output supply voltages VCCIO0–VCCIO7. Independent supply voltages for inputs and outputs may improve input signal noise immunity of the PLD 100. Each I/O bank of the PLD 100 may have an input pin that may be used to receive a voltage reference signal (e.g., VREF0–VREF7). When an I/O bank is configured to support a particular I/O standard that requires a voltage reference signal, the particular voltage reference signal may be presented to the input pin of the I/O bank. If an I/O bank is supporting an I/O standard that does not require a voltage reference signal, the input pin for that I/O bank may be used as a standard I/O pin. The I/O standards and the corresponding VCCIO/VCCIN may be summarized as in the following TABLE 1:

TABLE 1

| VCCIO/VCCIN | I/O STANDARDS |
|---|---|
| 3.3 V | LVTTL, LVCMOS, PCI, SSTL3, GTL+ |
| 2.5 V | LVCMOS2, SSTL2, GTL+ |
| 1.8 V | JEDEC 1.8 V |
| 1.5 V | HSTL Class I through IV |

The I/O standards and the corresponding voltage reference signals may be summarized as in the following TABLE 2.

TABLE 2

| VREF | I/O STANDARDS |
|---|---|
| None | JEDEC 1.8 V, LVCMOS, LVCMOS2, LVTTL, PCI |
| 0.75 V | HSTL Class I, HSTL Class II |
| 0.9 V | HSTL Class III, HSTL Class IV |
| 1 V | GTL+ |
| 1.25 V | SSTL2 Class I, SSTL2 Class II |
| 1.5 V | SSTL3 Class I, SSTL3 Class II |

The circuit 118 may be configured to provide support for each of the I/O standards listed in TABLE 1. The circuit 116 may be configured to support each of the I/O standards summarized in TABLE 2.

The present invention may provide a flexible programmable logic device that supports multiple core voltages, I/O voltages, and I/O standards in a single integrated circuit.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:
    a core circuit configured to (i) operate at a first supply voltage, (ii) receive one or more internal input signals, and (iii) generate one or more internal output signals;
    a first circuit configured to generate said first supply voltage in response to a second supply voltage;
    a second circuit configured to generate said one or more internal input signals in response to (i) one or more external input signals, (ii) said first supply voltage, and (iii) a third supply voltage; and
    a third circuit configured to generate one or more external output signals in response to (i) said one or more internal output signals, (ii) said first supply voltage, and (iii) a fourth supply voltage.

2. The programmable logic device according to claim 1, wherein said first circuit comprises a voltage regulator.

3. The programmable logic device according to claim 2, wherein said second and third circuits comprise an I/O block.

4. The programmable logic device according to claim 1, wherein said first supply voltage is 1.8v.

5. The programmable logic device according to claim 1, wherein said second supply voltage is in the range from 2.5v to 3.3v.

6. The programmable logic device according to claim 1, wherein said third supply voltage and said fourth supply voltage are in the range from 1.5v to 3.3v.

7. The programmable logic device according to claim 1, wherein said second circuit comprises one or more input circuits.

8. The programmable logic device according to claim 1, wherein said third circuit comprises one or more output circuits.

9. The programmable logic device according to claim 1, wherein said second supply voltage is equal to said first supply voltage and said first circuit is metal optioned to be inactive.

10. The programmable logic device according to claim 1, wherein said fourth supply voltage and said third supply voltage are generated by the same voltage supply.

11. The programmable logic device according to claim 1, wherein said external input signals have a positive voltage level greater than, equal to, or less than said first supply voltage.

12. The programmable logic device according to claim 1, wherein said external input signals have a positive voltage level of 1.5–3.3v.

13. The programmable logic device according to claim 1, wherein said external output signals have a positive voltage level greater than, equal to, or less than said first supply voltage.

14. The programmable logic device according to claim 1, wherein said external output signals have a positive voltage level of 1.5–3.3v.

15. The programmable logic device according to claim 2, further comprising a plurality of said second and third circuits, wherein said plurality of second and third circuits are arranged in one or more I/O banks.

16. The programmable logic device according to claim 15, wherein said one or more I/O banks have separate input voltage supplies, output voltage supplies, and voltage references.

17. The programmable logic device of claim 3, further comprising a plurality of I/O blocks, wherein said plurality of I/O blocks are configured as one or more I/O banks.

18. A programmable logic device comprising:
- means for (i) operating at a first supply voltage, (ii) receiving one or more internal input signals, and (iii) generating one or more internal output signals;
- means for generating said first supply voltage in response to a second supply voltage;
- means for generating said one or more internal input signals in response to (i) one or more external input signals, (ii) said first supply voltage, and (iii) a third supply voltage; and
- means for generating one or more external output signals in response to (i) said one or more internal output signals, (ii) said first supply voltage, and (iii) a fourth supply voltage.

19. A method for providing multiple voltage supply options to a programmable logic device comprising the steps of:
- (A) generating a first supply voltage for a core circuit in response to a second supply voltage;
- (B) generating one or more internal input signals for said core circuit in response to (i) one or more external input signals, (ii) said first supply voltage, and (iii) a third supply voltage; and
- (C) generating one or more external output signals in response to (i) one or more internal output signals from said core circuit, (ii) said first supply voltage, and (iii) a fourth supply voltage.

20. The method according to claim 19, wherein said step (A) comprises the sub-steps of:
- (A-1) monitoring a difference in voltage level between said first and said second supply voltage; and
- (A-2) controlling a pass transistor to maintain said first supply voltage at a predetermined value.

21. The programmable logic device according to claim 1, wherein said second circuit comprises:
- a first buffer circuit configured to receive said one or more external input signals and said third supply voltage;
- a second buffer circuit configured to generate said one or more internal input signals and receive said first supply voltage; and
- a level shifting circuit (i) coupling said first and second buffers and (ii) receiving said first and third supply voltages.

22. The programmable logic device according to claim 21, wherein said third circuit comprises:
- a third buffer circuit configured to receive (i) said one or more internal output signals and (ii) said first supply voltage;
- a driver circuit configured to (i) receive said fourth supply voltage and (ii) generate said one or more external output signals; and
- a second level shifting circuit (i) coupling said third buffer circuit and said driver circuit and (ii) receiving said first and fourth supply voltages.

* * * * *